(12) United States Patent
Han

(10) Patent No.: US 7,763,919 B2
(45) Date of Patent: Jul. 27, 2010

(54) CMOS IMAGE SENSOR AND MANUFACTURING METHOD THEREOF

(75) Inventor: Chang Hun Han, Icheon-Si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 647 days.

(21) Appl. No.: 11/612,647

(22) Filed: Dec. 19, 2006

(65) Prior Publication Data

US 2007/0145500 A1    Jun. 28, 2007

(30) Foreign Application Priority Data

Dec. 28, 2005    (KR) .................. 10-2005-0132650

(51) Int. Cl.
*H01L 31/062* (2006.01)
*H01L 31/113* (2006.01)

(52) U.S. Cl. .............. 257/292; 257/291; 257/293; 257/213; 257/E27.133; 257/288; 438/48; 438/57

(58) Field of Classification Search ......... 257/291–293, 257/213, 288, E27.133; 438/48, 57
See application file for complete search history.

(56) References Cited

U.S. PATENT DOCUMENTS

| 6,856,164 | B2 * | 2/2005 | Park et al. ................ 326/30 |
| 6,967,364 | B2 * | 11/2005 | Hong ..................... 257/292 |
| 7,071,020 | B2 * | 7/2006 | Hong ..................... 438/60 |
| 7,268,579 | B2 * | 9/2007 | Park ...................... 326/30 |
| 2005/0263829 | A1 | 12/2005 | Song et al. |
| 2007/0012970 | A1 * | 1/2007 | Mouli .................... 257/292 |

FOREIGN PATENT DOCUMENTS

CN    1641883    7/2005

* cited by examiner

*Primary Examiner*—Mary Wilczewski
*Assistant Examiner*—Telly D Green
(74) *Attorney, Agent, or Firm*—Saliwanchik, Lloyd & Saliwanchik

(57) ABSTRACT

A CMOS image sensor capable of improving characteristics of the image sensor by preventing damage to a photodiode region and a method for manufacturing the same are provided. The CMOS image sensor includes: a semiconductor substrate on which a device isolation region and an active region are defined; a photodiode region formed at the active region; a conductive plug formed on the photodiode region for connecting the photodiode region to a metal wiring; and a transistor formed enclosing the conductive plug.

6 Claims, 6 Drawing Sheets

CMOS IMAGE SENSOR AND MANUFACTURING METHOD THEREOF

RELATED APPLICATION

This application claims the benefit under 35 U.S.C. §119 (e), of Korean Patent Application Number 10-2005-0132650 filed Dec. 28, 2005, which is incorporated herein by reference in its entirety.

FIELD OF THE INVENTION

The present invention relates to a complementary metal oxide semiconductor (CMOS) image sensor and a method for manufacturing the same.

BACKGROUND OF THE INVENTION

In general, an image sensor is a semiconductor device that transforms an optical image to electrical signals. The image sensor is generally classified as a charge coupled device (CCD) or a CMOS image sensor.

The CCD type image sensor includes several MOS (metal oxide semiconductor) capacitors, closely positioned to one another, in which electric charge carriers are transferred to or saved in the MOS capacitors.

The CMOS image sensor has incorporated a switching mode by forming MOS transistors for each unit pixel with CMOS technology and using control circuits and signal-processing circuits in conjunction with the MOS transistors to sequentially detect outputs of the photodiodes.

The CCD has various disadvantages, such as a complicated driving mode, high power consumption, and inability to incorporate a signal processing circuit on-chip for the CCD due to the many mask processes.

The CMOS image sensor obtains an image from the formation of a photodiode and a MOS transistor within a unit pixel to detect signals using a switching mode. As mentioned above, because the CMOS image sensor makes use of CMOS manufacturing technology, the CMOS image sensor has low power consumption as well as a single manufacturing process requiring about 20 masks compared with the CCD manufacturing process requiring 30 to 40 masks.

As a result, the CMOS image sensor can integrate a signal processing circuit into a single chip. Accordingly, the CMOS image sensor is currently used in various applications, such as digital still cameras (DSC), PC cameras, and mobile cameras.

The CMOS image sensor is classified as a 3T type, a 4T type or a 5T type according to the number of transistors formed in a unit pixel. The 3T type CMOS image sensor includes a single photodiode and three transistors, and the 4T type CMOS image sensor includes a single photodiode and four transistors. The 3T type CMOS image sensor will now be described with reference to an equivalent circuit diagram and a lay out thereof.

FIG. 1 is an equivalent circuit diagram of a 3T type CMOS image sensor according to the related art. FIG. 2 is a layout view showing a unit pixel of a 3T type CMOS image sensor according to the related art.

As shown in FIG. 1, the unit pixel of the typical 3T type CMOS image sensor according to the related art includes one photodiode (PD) and three NMOS transistors T1, T2 and T3. The photodiode includes a cathode connected to the drain of the first NMOS transistor T1 and the gate of the second NMOS transistor T2.

Further, the sources of the first and second NMOS transistors T1 and T2 are connected to a power line that supplies a reference voltage, and the gate of the first NMOS transistor T1 is connected to a reset line that supplies a reset signal.

Also, the source of the third NMOS transistor T3 is connected to the drain of the second NMOS transistor, and the drain of the third NMOS transistor T3 is connected to a reading circuit (not shown) through a signal line. The gate of the third NMOS transistor T3 is connected to a column selection line that supplies a selection signal SLCT.

Accordingly, the first NMOS transistor T1 is a reset transistor Rx, and the second NMOS transistor T2 is a drive transistor DX. The third NMOS transistor T3 is a selection transistor Sx.

As shown in FIG. 2, an active region 10 is defined in the unit pixel of the 3T type CMOS image sensor. One photodiode 20 is formed at a wider part of an active region 10, and gate electrodes 30, 40, and 50 of three transistors are formed overlapping a remaining part of the active region 10.

Namely, a reset transistor Rx is formed by a first gate electrode 30, a drive transistor Dx is formed by a second gate electrode 40, and a select transistor Sx is formed by a third gate electrode 50.

Impurity ions are implanted in the remaining part of the active region to form source/drain regions for each transistor.

Accordingly, a power source voltage Vdd is applied to source/drain regions between the reset transistor Rx and the drive transistor Dx. Source/drain regions at one side of the select transistor Sx are coupled to a reading circuit.

The gate electrodes 30, 40, and 50 are connected to respective signal lines, and the respective signal lines are connected to an external drive circuit through a pad at one end thereof.

FIG. 3 is a cross-sectional view of the CMOS image sensor according to the related art taken along the line III-III' of FIG. 2.

As shown in FIG. 3, a P-expitaxial layer 102 is formed on a surface of a p$^+$-type semiconductor substrate 101 having a device isolation region and an active region defined thereon. A device isolation layer 103 is formed at the device isolation region of the semiconductor device 101 between input regions of red light, green light, and blue light.

Moreover, a gate insulating layer 104 is interposed on the transistor region of the semiconductor substrate 101 to form gate electrodes 105. Insulating sidewalls 106 are formed at both sides of the gate electrode 105, and an n$^-$-type diffusion region 107 is formed at a photodiode region at one side of the gate electrode 105.

Furthermore, an n$^+$-type diffusion region 108 is formed in a transistor region of the substrate at another side of the gate electrode 105, and an interlayer dielectric 109 is formed on the semiconductor substrate 101 including the gate electrode 105. A conductive plug 110 is formed to pass through the interlayer dielectric 109, and is electrically connected to the n$^-$-type diffusion region 107 which is the photodiode region.

A metal wiring 111 is formed on the interlayer dielectric 109 in contact with the conductive plug.

The photodiode region receives light, and is a significantly important region that can be adversely affected by plasma damage during the fabrication process.

In particular, upon forming the gate electrode 105, a first plasma damage may be substantially applied to the photodiode region. Further, during the formation of the insulating layer sidewalls 106, a second plasma damage may again be applied thereto.

In addition, when the interlayer dielectric is selectively removed to form a contact hole, a third plasma damage may be applied to the photodiode region.

The multiple plasma damage applied to the photodiode region functions to generate electrons in a state free of light, thereby weakening the CMOS image sensor.

BRIEF SUMMARY

Accordingly, embodiments of the present invention are directed to a CMOS image sensor and a method for manufacturing the same that substantially obviates one or more problems due to limitations and disadvantages of the related art.

An object of the present invention is to provide a CMOS image sensor capable of improving characteristics of the image sensor by preventing or minimizing damage to a photodiode region and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a CMOS (complementary metal oxide semiconductor) image sensor comprising: a semiconductor substrate on which a device isolation region and an active region are defined; a photodiode region formed on the active region; a conductive plug formed on the photodiode region for connecting the photodiode region to a metal wiring; and a transistor formed to enclose the conductive plug.

In another embodiment of the present invention, there is provided a CMOS (complementary metal oxide semiconductor) image sensor comprising: a semiconductor substrate on which a device isolation region and an active region are defined; a transistor formed on the active region to define a photodiode region and a transistor region, wherein the transistor further divides the photodiode region into a first region and a second region; an interlayer dielectric including a contact hole formed therein to expose the first region; and a conductive plug formed on the contact hole.

In another aspect of the present invention, there is provided a method for manufacturing a CMOS (complementary metal oxide semiconductor) image sensor comprising: defining a device isolation region and an active region on a semiconductor device; forming a gate electrode dividing the active region into a photodiode region and a transistor region, wherein the gate electrode further divides the photodiode region into a first region and a second region; implanting impurity ions in the photodiode region; forming insulating layer sidewalls at both sidewalls of the gate electrode; implanting impurity ions in the transistor region; forming an interlayer dielectric having a contact hole to expose the first region; and forming a conductive plug in the contact hole.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a CMOS image sensor and a method for manufacturing the same according to an embodiment of the present invention will be explained with reference to the accompanying drawings.

Figure 1:
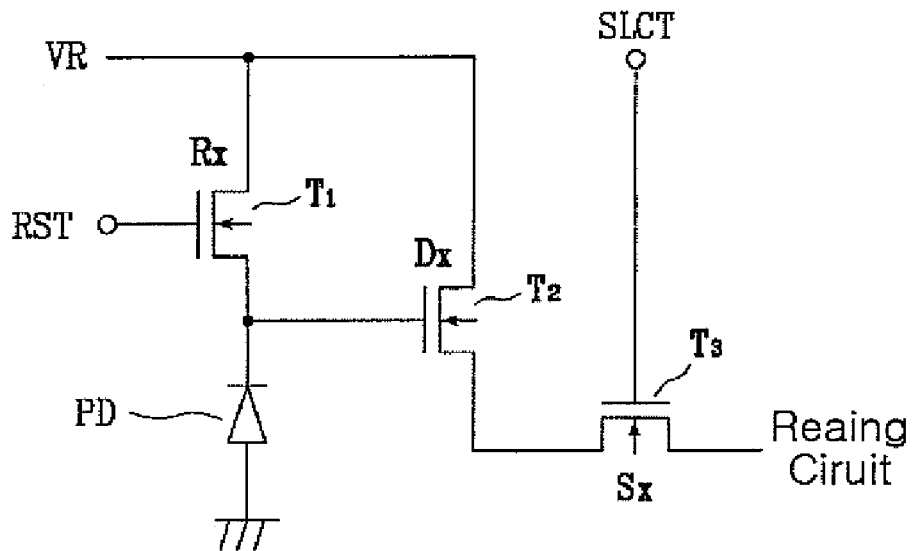
FIG. 1 is an equivalent circuit diagram of a 3T type CMOS image sensor according to the related art.
Figure 2:
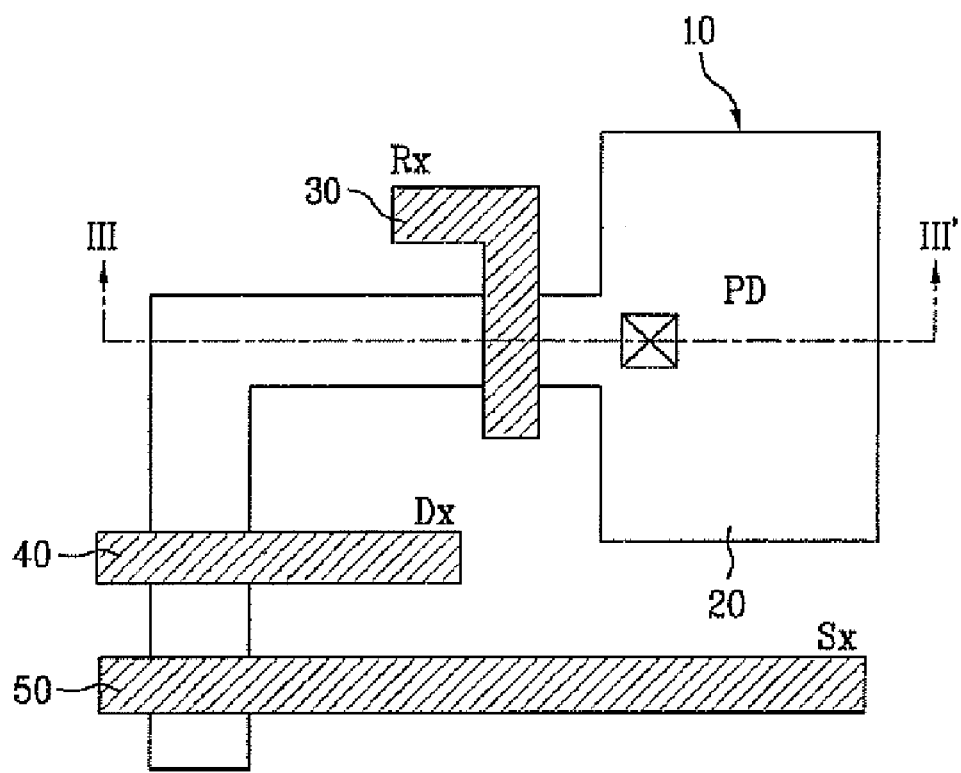
FIG. 2 is a layout view showing a unit pixel of a 3T type CMOS image sensor according to the related art.
Figure 3:
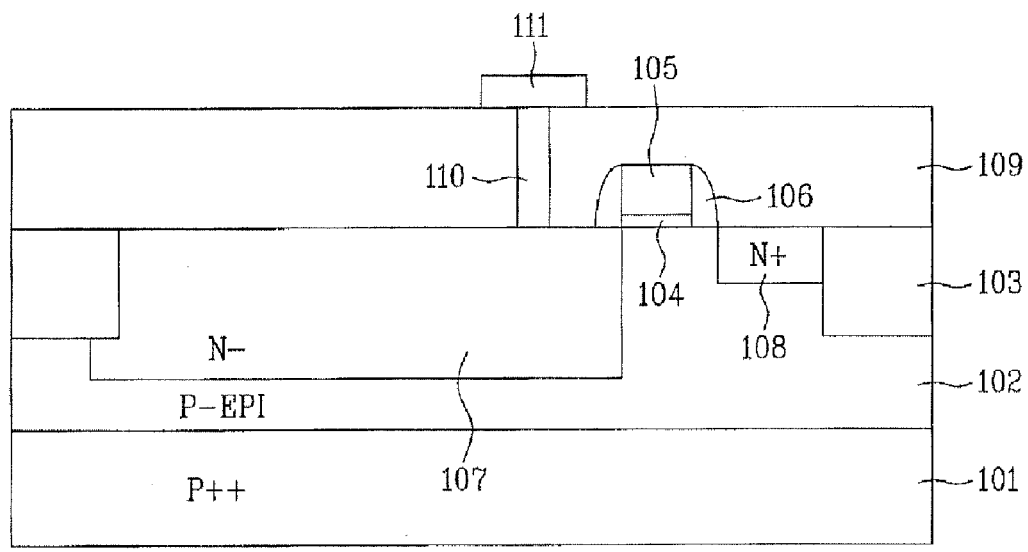
FIG. 3 is a cross-sectional view of the CMOS image sensor according to the related art of taken along the line III-III' of FIG. 2.
Figure 4A:
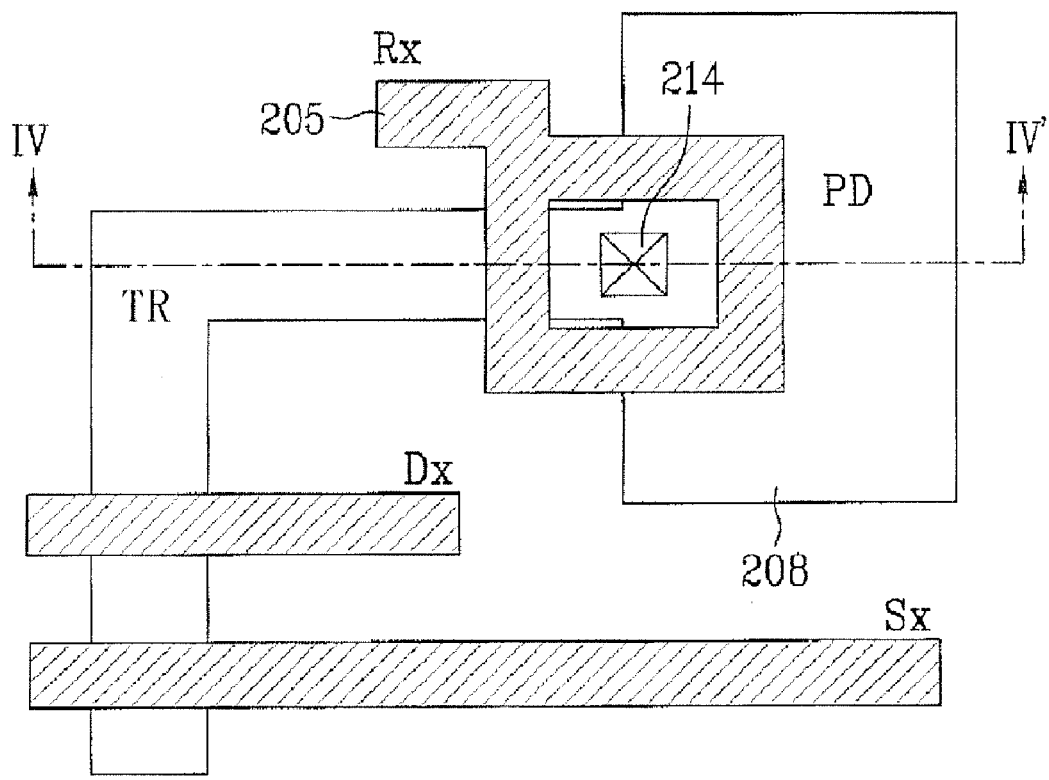
FIG. 4A is a layout view showing a unit pixel of a CMOS image sensor according to an embodiment of the present invention.
Figure 4B:
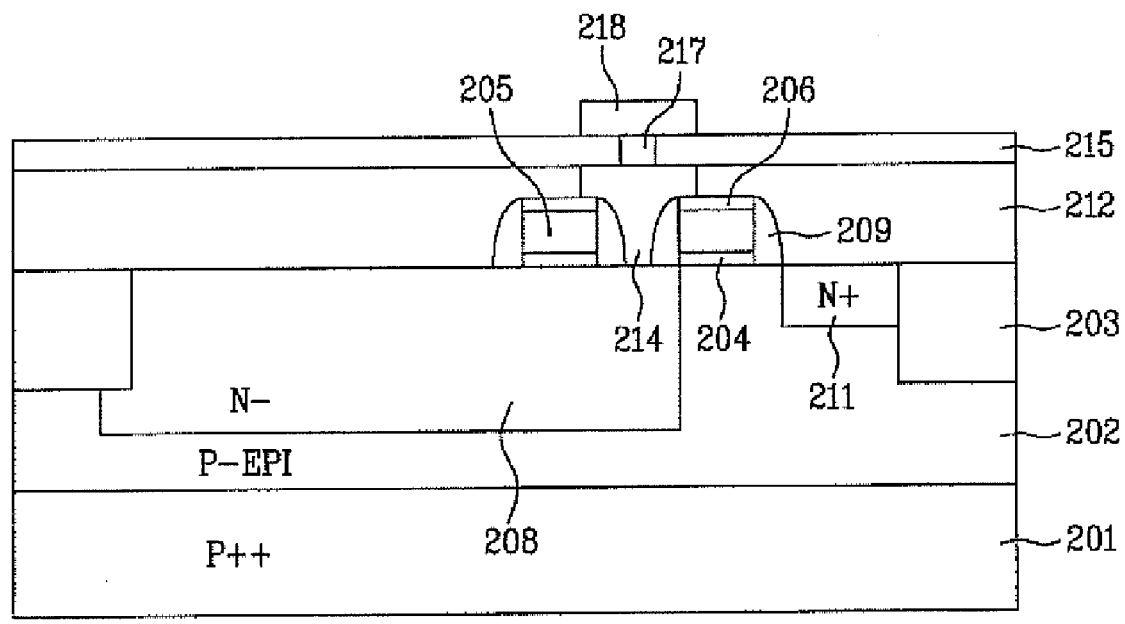
FIG. 4B is a cross-sectional view of the CMOS image sensor of FIG. 4 taken along the line IV-IV'.

FIG. 4A is a layout view showing a unit pixel of a CMOS image sensor according to an embodiment of the present invention. FIG. 4B is a cross-sectional view of the CMOS image sensor of FIG. 4 taken along the line IV-IV'.

Referring to FIG. 4A and FIG. 4B, a CMOS image sensor can include a semiconductor substrate 201 having a device isolation region and an active region defined therein. The active region includes a photodiode region PD and a transistor region TR.

A device isolation layer 203 can be formed on the device isolation region of the semiconductor substrate 201 and can function to isolate input regions of red light, green light, and blue light. An $n^-$-type diffusion region 208 can be formed on the photodiode region of the semiconductor device 201.

A gate electrode 205 can be formed on the substrate with a gate insulating layer 204 formed therebetween. The gate electrode 205 can incorporate a portion enclosing a part of the photodiode region PD such that the gate electrode extends along the perimeter of the part of the photodiode region in a square-like shape. A cap oxide layer 206 can be formed on the gate electrode 205, and insulating layer sidewalls 209 can be formed at sidewalls of the gate electrode 205 and the cap oxide layer 206.

In addition, an $n^+$-type diffusion region 211 can be formed on a transistor region TR of the semiconductor substrate 201, and a first insulating layer 212 can be formed on an entire surface of the semiconductor substrate 201.

A first contact hole can be formed in the first insulating layer 212 to expose the part of the photodiode region PD enclosed by the gate electrode, and a first conductive plug 214 can be formed inside the first contact hole.

Moreover, a second interlayer dielectric 215 can be formed on an entire surface of the semiconductor substrate 201, and a second contact hole can be formed in the second interlayer dielectric 215 to expose a predetermined part of a surface of the first conductive plug 214.

A second conductive plug 217 can be formed in the second contact hole, and a metal wiring 218 can be formed, on and connected to the second conductive plug 217.

In the CMOS image sensor according to an embodiment of the present invention, when a contact portion of the photodiode region is formed within an enclosed part of the photo region, where the gate electrode of the reset transistor encloses the part, a conductive plug can be filled therebetween, thereby reducing the damage applied to the photodiode region.

FIGS. 5A to 5F are cross-sectional views showing a method for manufacturing a CMOS image sensor according to an embodiment of the present invention.

Figure 5A:
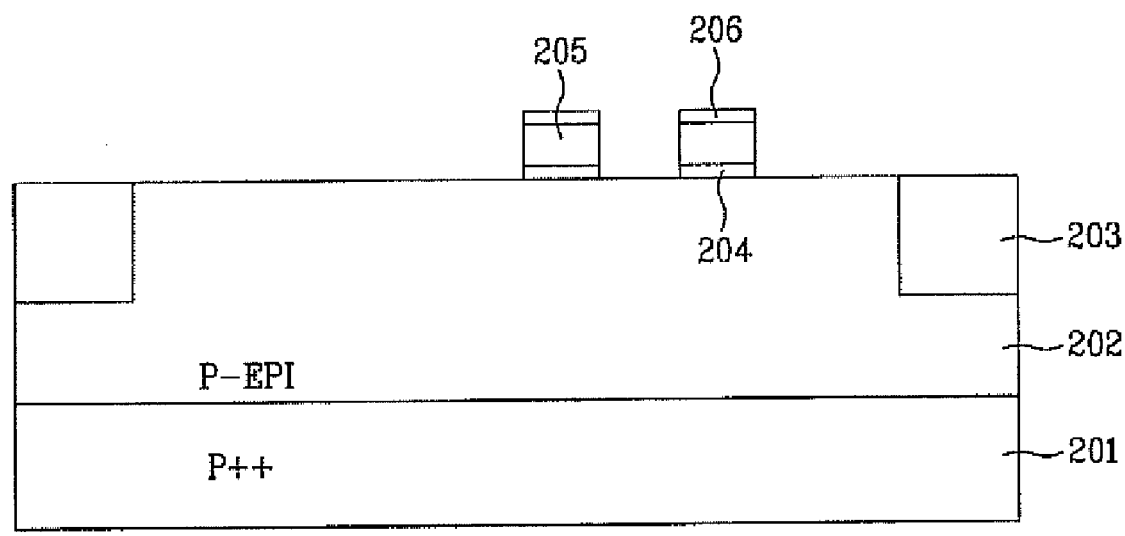
FIGS. 5A to 5F are cross-sectional views showing a method for manufacturing a CMOS image sensor according to an embodiment of the present invention.

Referring to FIG. 5A, an epitaxial layer 202 can be formed on a semiconductor substrate 201 by an epitaxial process.

Here, the epitaxial layer 202 allows a depletion region in the photodiode region to form to a great depth to increase the performance of a low voltage photodiode, thereby enhancing a photosensitivity of the CMOS image sensor.

Referring to FIG. 5A, a photodiode region, a transistor region, and a device isolation region can be defined in the semiconductor device 201, and a device isolation layer 203 is formed at the device isolation region using a STI process or a LOCOS process.

Next, a gate insulating layer 204, a conductive layer (for example, high concentration polysilicon layer), and an oxide layer can be sequentially formed on an entire surface of a semiconductor substrate 201 on which the device isolation layer 203 is formed. Through photolithography and etching processes, the oxide layer, the conductive layer, and the gate insulating layer 204 can be selectively removed to form a gate electrode 205 of each transistor and a cap oxide layer 206 at an upper portion of the gate electrode 205.

Here, the gate insulating layer 204 may be formed by a thermal oxidizing process or a CVD process, and a silicide layer may be further formed on the conductive layer to form a gate electrode.

In a further embodiment, a thermal oxidizing process can be performed on the gate electrode 205 and a surface of the semiconductor device 201 to form a thermal oxidizing layer (not shown).

The gate electrode 205 illustrated in the figures functions as a gate electrode of a reset transistor, and is formed to incorporate a square portion enclosing a part of the photodiode region, as shown in FIG. 4A.

Figure 5B:
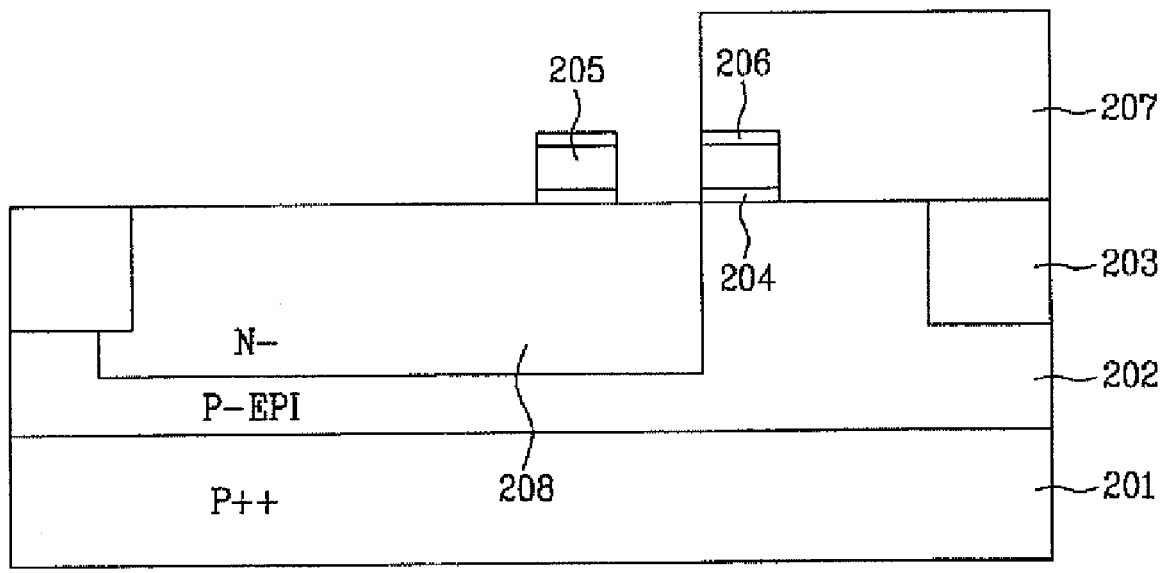

Referring to FIG. 5B, after an entire surface of the semiconductor substrate 201 has been coated with a first photoresist layer 207, the first photoresist layer 207 can be patterned by exposure and developing processes to expose the photodiode region.

Then, a low concentration of second conductive type ($n^-$-type) impurity ions can be implanted in the photodiode region of the semiconductor substrate 201 using the patterned first photoresist layer 207 as a mask to form an $n^-$-type diffusion region 208.

Figure 5C:
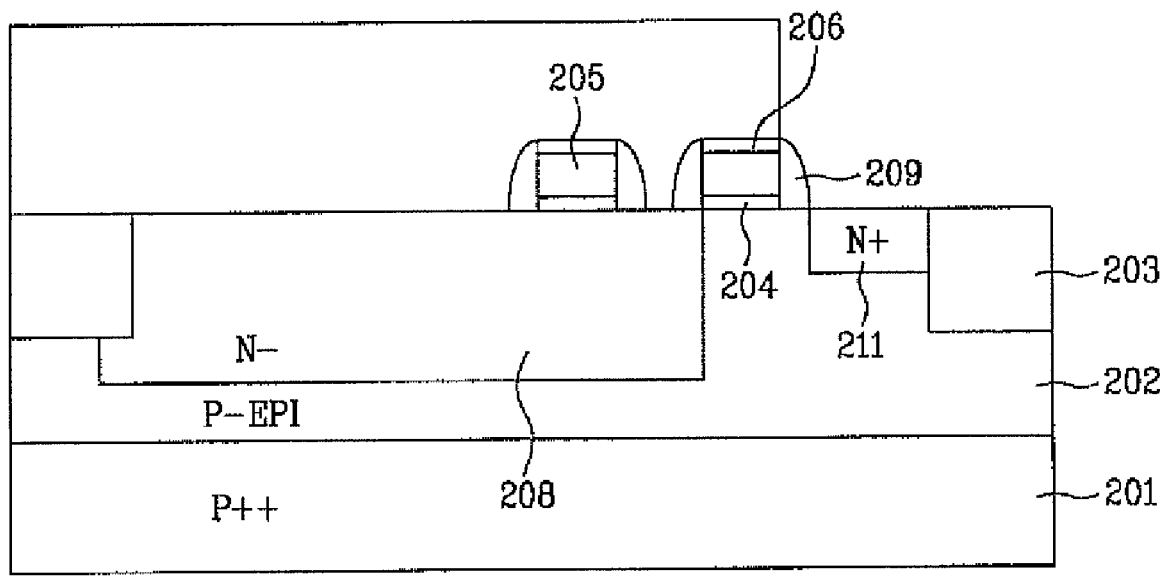

Referring to FIG. 5C, after the first photoresist layer 207 has been removed; an insulating layer can be formed on the semiconductor substrate 201 and etched back to form insulating sidewalls 209 at sidewalls of the gate electrode 205 and the cap oxide layer 206.

Thereafter, a second photoresist layer 210 can be coated on the semiconductor substrate 201 and selectively patterned by exposure and developing processes to expose a transistor region.

Then, a high concentration of second conductive type ($n^+$-type) impurity ions can be implanted in the transistor region of the semiconductor substrate 201 using the patterned second photoresist layer 210 as a mask to form an $n^+$-type diffusion region 211.

Figure 5D:
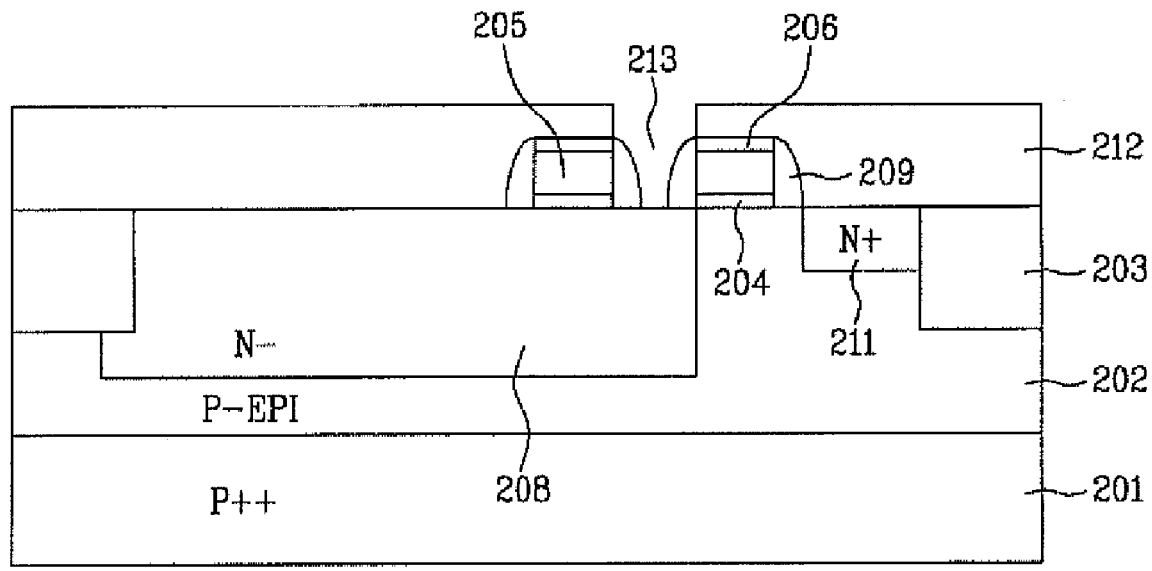

Referring to FIG. 5D, after the second photoresist layer 210 has been removed, a thermal treatment process (for example, a rapid thermal annealing) can be performed to diffuse impurity ions in the $n^-$-type diffusion region 208 and the $n^+$-type diffusion region 211.

Next, a first interlayer dielectric 212 can be formed at an entire surface of the semiconductor substrate 201 including the gate electrode 205. A first contact hole 213 can be formed through photolithography and etching processes to expose a predetermined part of the photodiode region between the gate electrode 205, namely, between the insulating layer sidewalls 209.

Figure 5E:
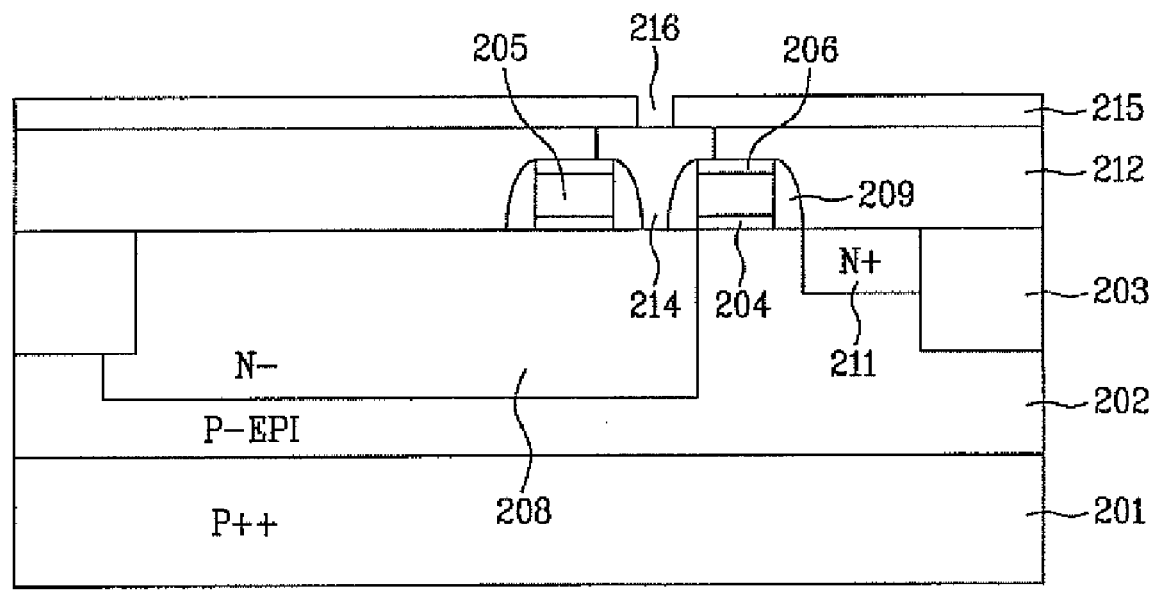

Referring to FIG. 5E, a polysilicon layer or a metal layer such as tungsten can be formed on the semiconductor substrate 201 including the first contact hole 213. Then, a planarization process can be carried out to form a first conductive plug 214 in the first contact hole 213.

Subsequently, a second interlayer dielectric 215 can be formed on the semiconductor substrate 201 including on the first conductive plug 214. Then, the second interlayer dielectric 215 can be selectively removed to expose a surface of the first conductive plug 214 through photolithography and etching processes, thereby forming a second contact hole 216.

Figure 5F:
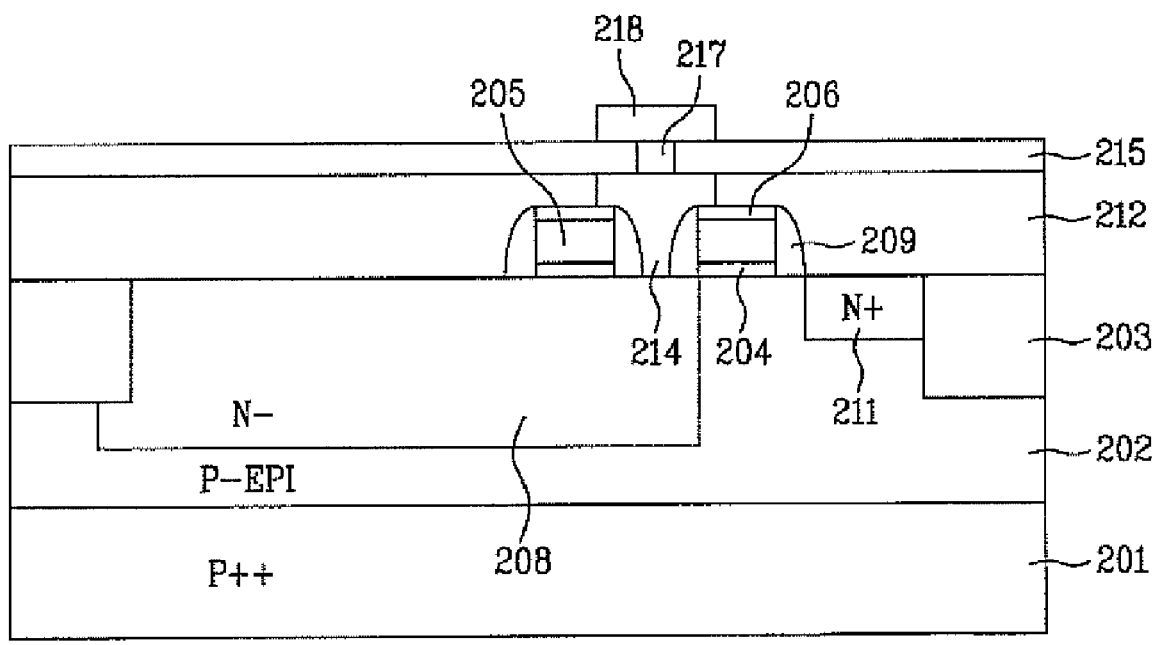

Referring to FIG. 5F, a polysilicon layer or a metal layer such as tungsten can be formed on the semiconductor substrate 201 including the second contact hole 216. Then, a planarization process can be carried out to form a second conductive plug 217 in the second contact hole 216.

Then, after a metal layer such as aluminum or copper has been deposited on the semiconductor substrate 201, the metal layer can be selectively removed through a photolithography and etching process to form a metal wiring 218, which is electrically connected to the second conductive plug 217.

As is clear from the forgoing description, in the CMOS image sensor and the method for manufacturing the same, damage applied to the photodiode region can be minimized, which enhances the characteristics of the image sensor. This may be accomplished through the formation of the gate electrode of a reset transistor, which is formed to enclose a part of the photodiode region, such that a contact part for an electric connection is formed therebetween.

It will be apparent to those skilled in the art that various modifications and variations can be made in the present invention. Thus, it is intended that the present invention covers the modifications and variations of this invention provided they come within the scope of the appended claims and their equivalents.

I claim:

1. A CMOS (complementary metal oxide semiconductor) image sensor comprising:
    a semiconductor substrate on which a device isolation region and an active region are defined;
    a photodiode region formed on the active region;
    a conductive plug formed at the photodiode region for connecting the photodiode region to a metal wiring; and
    a transistor formed enclosing the conductive plug, wherein the perimeter of the conductive plug is completely surrounded by the transistor.

2. The CMOS image sensor according to claim 1, wherein the perimeter of the conductive plug has a square shape.

3. A CMOS (complementary metal oxide semiconductor) image sensor comprising:
    a semiconductor substrate on which a device isolation region and an active region are defined;

a photodiode region formed on the active region;

a transistor region formed on the active region, wherein the transistor region is horizontally arranged with the photodiode region;

a conductive plug making a contact with a top surface of the photodiode region;

a transistor formed on the transistor region wherein a portion of the transistor extends into the photodiode region around the perimeter of the conductive plug to provide an enclosing portion of the transistor on the photodiode region; and an interlayer dielectric formed on the semiconductor substrate including the transistor, wherein the conductive plug is formed in a contact hole in the interlayer dielectric.

4. The CMOS image sensor according to claim 3, wherein the perimeter of the conductive plug has a square shape.

5. The CMOS image sensor according to claim 3, wherein the transistor comprises a gate insulating layer, a gate electrode, and an insulating layer sidewall.

6. The CMOS image sensor according to claim 5, wherein a part of the conductive plug is enclosed by the interlayer dielectric, and another part of the conductive plug is enclosed by the insulating layer sidewall of the transistor.

* * * * *